US011515175B2

(12) United States Patent
Akiyama et al.

(10) Patent No.: US 11,515,175 B2
(45) Date of Patent: Nov. 29, 2022

(54) WAFER INSPECTION APPARATUS

(71) Applicant: Tokyo Electron Limited, Tokyo (JP)

(72) Inventors: Shuji Akiyama, Yamanashi (JP); Hiroki Hosaka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 543 days.

(21) Appl. No.: 16/604,652

(22) PCT Filed: Apr. 13, 2018

(86) PCT No.: PCT/JP2018/015497
§ 371 (c)(1),
(2) Date: Oct. 11, 2019

(87) PCT Pub. No.: WO2018/198819
PCT Pub. Date: Nov. 1, 2018

(65) Prior Publication Data
US 2020/0168481 A1 May 28, 2020

(30) Foreign Application Priority Data
Apr. 24, 2017 (JP) .............................. JP2017-085424

(51) Int. Cl.
*H01L 21/67* (2006.01)
*F24F 11/00* (2018.01)
*G01R 31/26* (2020.01)
*G01R 1/04* (2006.01)

(52) U.S. Cl.
CPC .... *H01L 21/67017* (2013.01); *F24F 11/0001* (2013.01); *G01R 31/2601* (2013.01); *H01L 21/67288* (2013.01); *G01R 1/04* (2013.01)

(58) Field of Classification Search
CPC . G01R 1/04; G01R 31/2601; H01L 21/67017; H01L 21/67288
See application file for complete search history.

(56) References Cited

U.S. PATENT DOCUMENTS

2008/0050924 A1* 2/2008 Wakabayashi .... H01L 21/67778
156/345.31

FOREIGN PATENT DOCUMENTS

| JP | 2014-075420 | 4/2014 |
| JP | 2015-144155 | 8/2015 |

* cited by examiner

*Primary Examiner* — Feifei Yeung Lopez
(74) *Attorney, Agent, or Firm* — IPUSA, PLLC

(57) ABSTRACT

A wafer inspection apparatus according to one embodiment is a wafer inspection apparatus including a plurality of inspection parts arranged in a height direction and a lateral direction, and includes a pair of air circulating means disposed at both ends in a longitudinal direction of an air circulating region including the plurality of inspection parts arranged in the lateral direction and configured to circulate air in the circulating region.

9 Claims, 6 Drawing Sheets

WAFER INSPECTION APPARATUS

TECHNICAL FIELD

The present disclosure relates to a wafer inspection apparatus.

BACKGROUND ART

Conventionally, fan filter units (FFU) have been installed in locations that require cleanliness such as clean rooms and the inside of semiconductor manufacturing apparatuses, thereby cleaning the internal environment. Moreover, in inspection apparatuses such as prober apparatuses, a technique for circulating air inside the inspection part through the FFU is being utilized due to the demand for cold inspection (see, for example, Patent Document 1).

In recent years, from the viewpoint of improving the throughput of an inspection process, a wafer inspection apparatus has been developed in which a plurality of inspection parts is arranged in a height direction and a width direction (for example, see Patent Document 2).

PRIOR ART DOCUMENTS

Patent Documents

Patent Document 1: Japanese Laid-Open Patent Application Publication No. 2015-144155
Patent Document 2: Japanese Laid-Open Patent Application Publication No. 2014-075420

SUMMARY OF THE INVENTION

Problem to be Solved by the Invention

However, in a wafer inspection apparatus having a plurality of inspection parts arranged in a height direction and a lateral direction, installing an FFU in each inspection part requires a large amount of installation space. Also, a control system and the like need to be prepared for each FFU, the wafer inspection apparatus becomes complicated.

Therefore, the present invention is intended to provide a wafer inspection apparatus including a plurality of inspection parts in a height direction and a width direction that can save a space and can efficiently maintain cleanliness of the inside of an inspection part.

Means for Solving the Problem

In order to achieve the above-described object, a wafer inspection apparatus according to one aspect of the present invention is a wafer inspection apparatus including a plurality of inspection parts arranged in a height direction and a lateral direction, and includes a pair of air circulating means disposed at both ends in a longitudinal direction of an air circulating region including the plurality of inspection parts arranged in the lateral direction and configured to circulate air in the circulating region.

Advantageous Effect of the Invention

According to the disclosed wafer inspection apparatus, effective cleanliness of the interior of an inspection part can be maintained while saving a space in a wafer inspection apparatus having multiple inspection parts arranged in a height direction and a lateral direction.

EMBODIMENTS FOR IMPLEMENTING THE INVENTION

Hereinafter, embodiments for carrying out the present disclosure will be described with reference to the drawings. In the present specification and drawings, as for substantially the same structure, the overlapping description will be omitted by providing the same numerals.

[Wafer Inspection Apparatus]

An wafer inspection apparatus according to an embodiment of the present invention is a wafer batch test system in which a plurality of inspection parts are mounted in a height direction and a lateral direction so that the inspection parts can independently and simultaneously inspect the wafers and perform high-speed lot processing. In addition, a pair of air circulating means is provided at both longitudinal ends of a circulation area including a plurality of laterally arranged inspection parts to circulate air in the circulation area, thereby saving space and efficiently maintaining the cleanliness of the inside of the inspection part.

Figure 1:
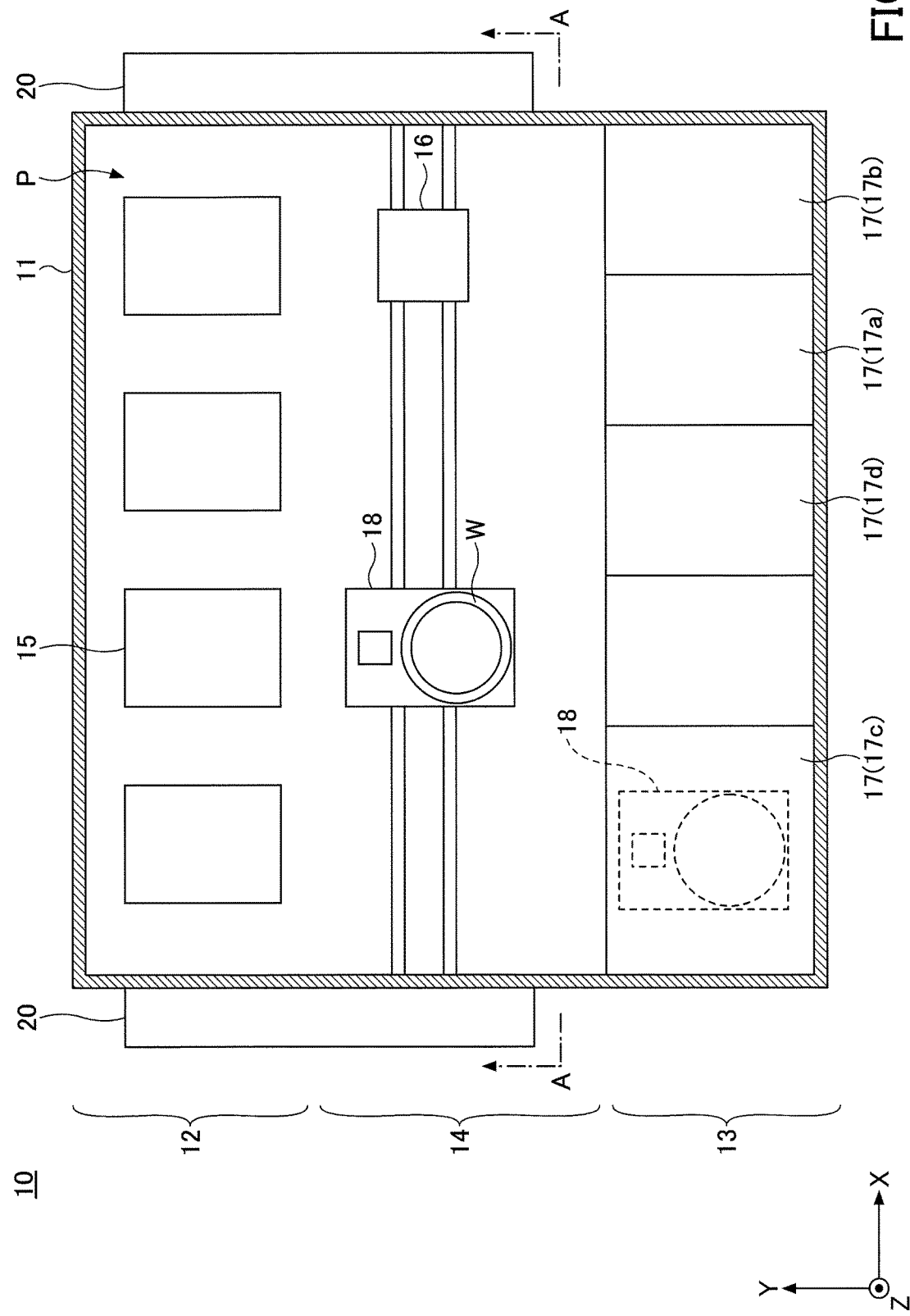
FIG. 1 is a schematic cross-sectional view illustrating an example of a wafer inspection apparatus according to an embodiment of the present invention.
Figure 2:
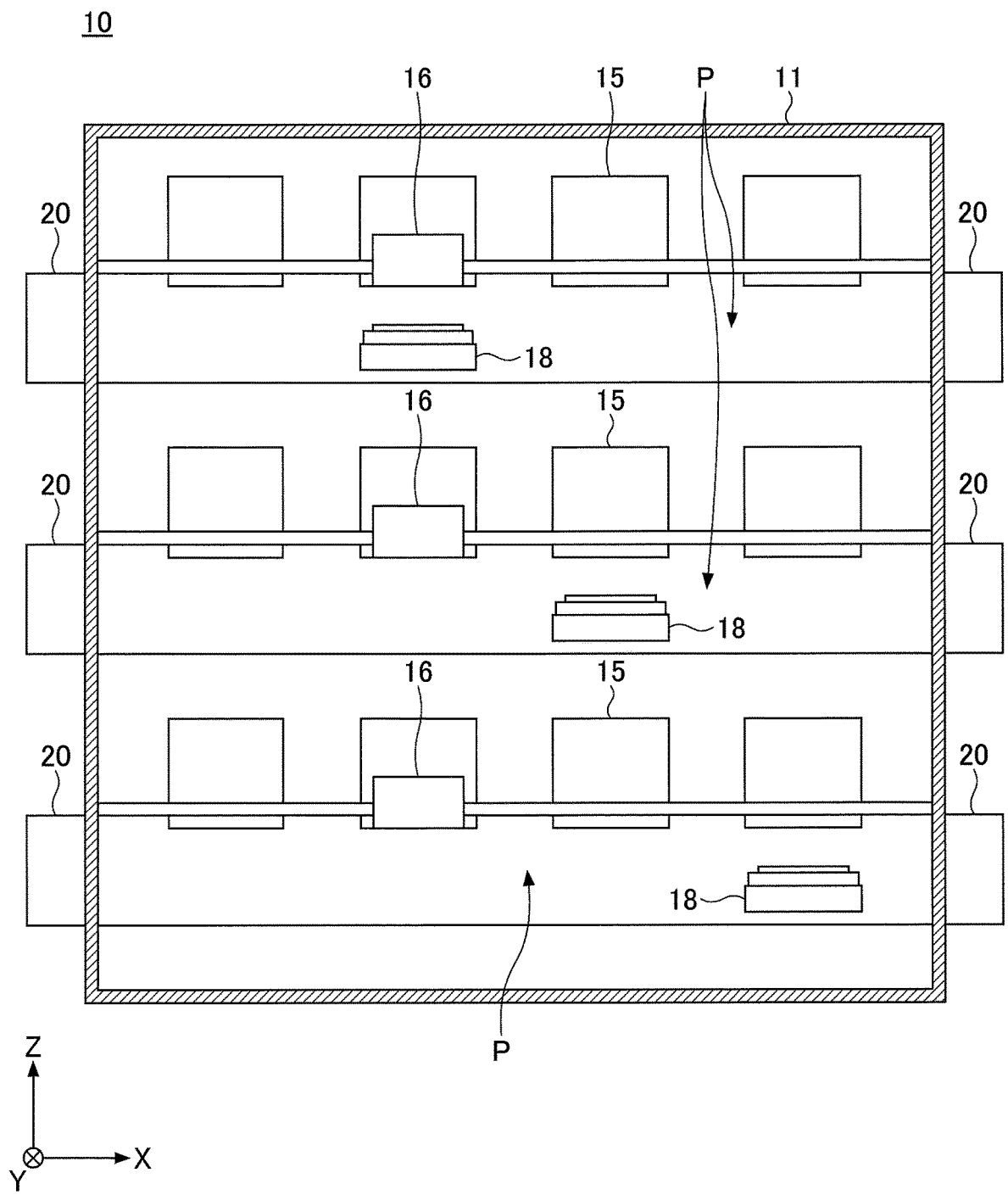
FIG. 2 is a cross-sectional view of a single dashed line A-A in FIG. 1.

FIG. 1 is a schematic cross-sectional view illustrating an example of a wafer inspection apparatus according to an embodiment of the present invention. FIG. 2 is a cross-sectional view of a single dashed line A-A in FIG. 1.

As illustrated in FIG. 1 and FIG. 2, a wafer inspection apparatus 10 includes an inspection chamber 11. The inspection chamber 11 has a test area 12, a carry-in/out area 13, and a transfer area 14. It should be noted that the inspection area 12 and the transfer area 14 constitute a circulating region P.

The inspection area 12 is an area for inspecting the electrical characteristics of each semiconductor device formed in a wafer W and includes a plurality of inspection parts. Testers 15 as interfaces for multiple wafer inspection are disposed in the inspection area 12 corresponding to the plurality of inspection parts. Specifically, the test area 12 has a multistage structure of the plurality of testers 15 arranged horizontally, for example, a three-stage structure, and a single tester side camera 16 is arranged corresponding to each of the tester rows. Each of the tester side cameras 16 moves horizontally along a corresponding tester row to locate a wafer W or the like that is carried by a transfer stage 18 in front of each of the testers 15 that constitute the tester row.

The carry-in/out area 13 is an area for carrying in/out the wafer W to/from the inspection chamber 11. The carry-in/out area 13 is divided into a plurality of storage spaces 17. In each storage space 17, a port 17a for receiving a FOUP, which is a container for accommodating a plurality of wafers W, an aligner 17b for aligning the wafers W, a loader 17c in which a probe card is carried in and out, and a controller 17d for controlling the operation of the respective parts of the wafer inspection apparatus 10 are disposed. The controller 17d is an example of a control means.

The transfer area 14 is an area disposed between the inspection area 12 and the carry-in/out area 13. The transfer stage 18 that is movable not only to the transfer area 14 but also to the inspection area 12 or the carry-in/out area 13 is disposed in the transfer area 14. The transfer stage 18 receives the wafer W from the port 17a of the carry-in/out area 13 and transfers the wafer W to each of the testers 15, and also transfers the wafer W, whose inspection for the electrical characteristics of the semiconductor device has been finished, from each of the testers 15 to the port 17a.

A pair of air circulating means 20 for circulating air in the circulating region P is disposed at both ends of the circulating region P in the longitudinal direction (the X direction in the drawing). The pair of air circulating means 20 is disposed for each of the circulating regions P formed in the height direction, as illustrated in FIG. 2. In the illustrated example, three circulating regions P are formed in the height direction, and a pair of air circulating means 20 is disposed in each circulating region P.

Figure 3:
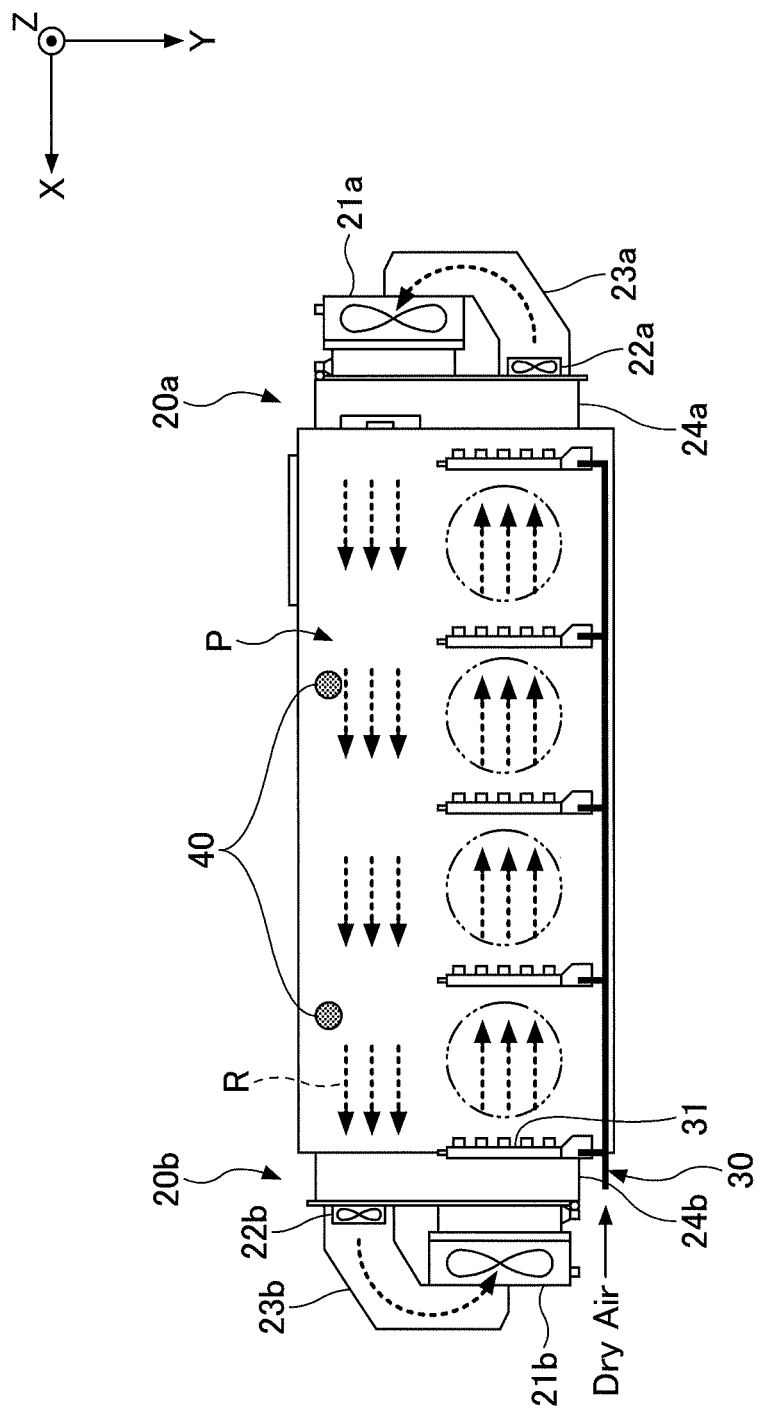
FIG. 3 is a diagram illustrating an example of an air circulating means.

FIG. 3 is a diagram illustrating an example of the air circulating means 20. As illustrated in FIG. 3, a pair of air circulating means 20 includes an air circulating means 20a disposed at one longitudinal end of the circulating region P and an air circulating means 20b disposed at the other longitudinal end of the circulating region P. The air circulating means 20a includes a fan filter unit (FFU) 21a, a suction fan 22a, a duct 23a, and a bracket 24a. The air circulating means 20b includes an FFU 21b, a suction fan 22b, a duct 23b, and a bracket 24b.

The FFUs 21a and 21b include a filter for preventing dust from occurring by allowing air from ducts 23a and 23b to pass therethrough, respectively, and a blow-out fan for blowing clean air whose dust has been removed by the filter into the circulating region P. The FFU 21a and FFU 21b are disposed diagonally to each other in the circulating region P. In the FFU 21a and 21b, the rotation speed of the blow fan is controlled by the controller 17d, so that the air volume of the clean air blown into the circulating region P is adjusted. The amount of clean air blown into the circulating region P is determined according to the size of the circulating region P, for example. The controller 17d may automatically control the amount of clean air blown from the FFUs 21a and 21b into the circulating region P according to the operating conditions of the plurality of inspection parts.

The suction fans 22a and 22b suction air from the inside of the circulating region P. The suction fan 22a and the suction fan 22b are disposed diagonally to each other in the circulation region P. The air suctioned from the circulating region P by the suction fans 22a and 22b is fed to the ducts 23a and 23b, respectively. By providing the suction fans 22a and 22b, air in the circulating region P can be efficiently supplied into the ducts 23a and 23b, and thus air in the circulating region P can be efficiently circulated. If air in the circulating region P can be efficiently circulated by only the FFU 21a and 21b, disposing the suction fans 22a and 22b is not required.

The ducts 23a and 23b are connected at one end to the FFU 21a and 21b and at the other end to the suction fans 22a and 22b, respectively. The ducts 23a and 23b convey the air suctioned by the suction fans 22a and 22b to the FFUs 21a and 21b, respectively.

By operating the FFUs 21a and 21b and the suction fans 22a and 22b, a circulation path R of air is faulted in the counter-clockwise direction of FIG. 3. That is, the pair of air circulating means 20 forms the air circulation path R that rotates in a rotation direction about the axis of rotation of the height direction (the Z direction in the drawing).

A dry air supply means 30 capable of supplying dry air (dry air) for lowering the dew point of air to a plurality of locations of the circulation area P is disposed in the circulating region P. The dry air supply means 30 includes a plurality of dry air supply nozzles 31, and each of the respective dry air supply nozzles 31a can supply a predetermined (for example, 60 L/min) amount of dry air to the circulating region P. A plurality (for example, five) of discharge holes is formed in the dry air supply nozzle 31. In the illustrated example, five dry air supply nozzles 31 are provided at a predetermined distance along the circulation path R.

A dew point sensor 40 may also be provided within the circulating region P. The controller 17d may control an air flow rate of clean air blown into the circulating region P by controlling the FFU 21a, 21b and/or the suction fans 22a, 22b based on the detected value detected by the dew point sensor 40. The controller 17d may also adjust the air flow rate of dry air fed from the dry air supply means 30 into the circulating region P based on the detected value detected by the dew point sensor 40. In the illustrated example, two dew point sensors 40 are provided, but the dew point sensors 40 may be one or not less than three.

Thus, in the wafer inspection apparatus 10, by supplying dry air into the circulating region P and circulating air in the circulating region P, the inside of the circulating region P can be maintained at a low temperature (for example, a dew point temperature of −40 degrees Celsius or less) and a clean environment (for example, class 1000, class 100). Then, each tester 15 inspects the electrical characteristics within the circulating region P maintained in a low temperature and a clean environment by applying an electrical signal to each semiconductor device of the wafer W. At this time, while the transfer stage 18 carries the wafer W toward one tester 15, another tester 15 can inspect the electrical characteristics of each semiconductor device of another wafer W. Therefore, the inspection efficiency of the wafer W can be improved.

Figure 4:
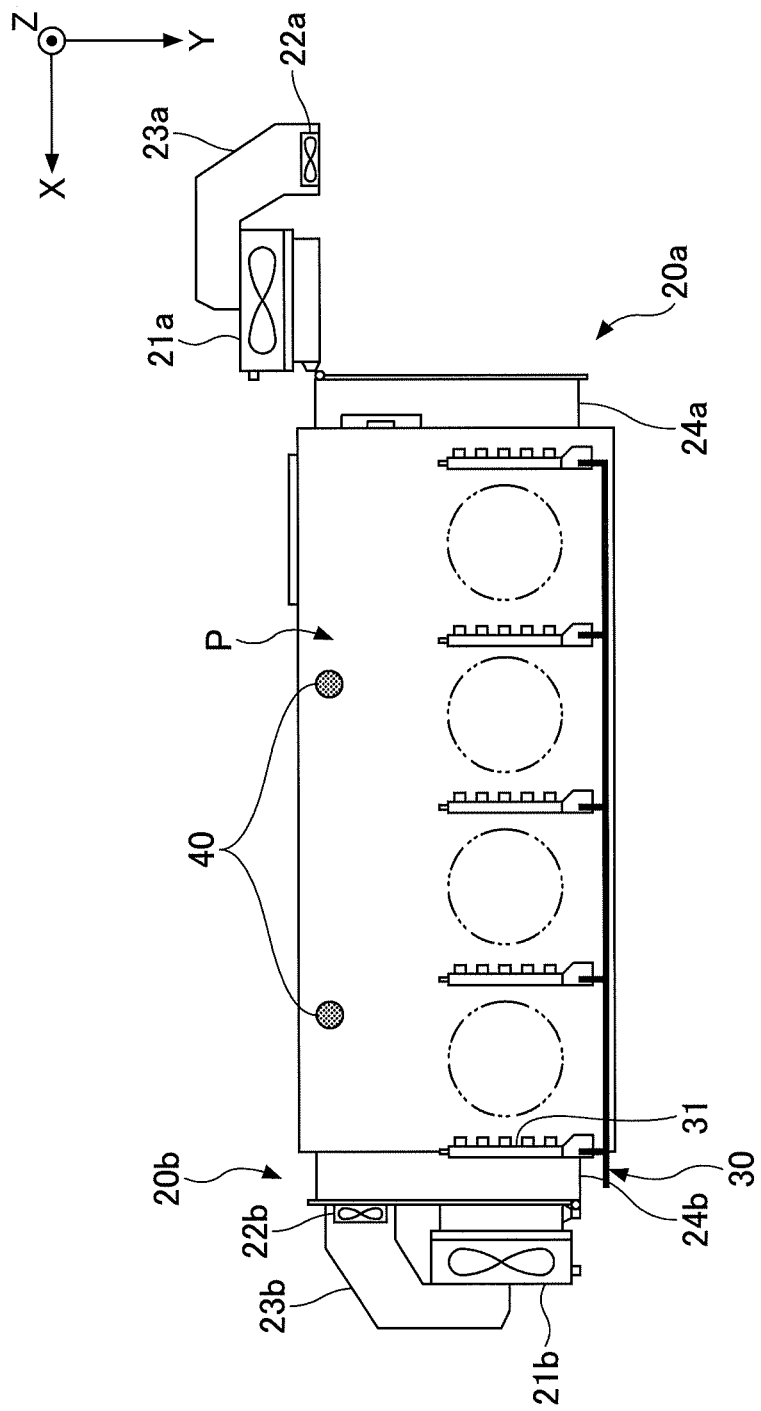
FIG. 4 is a diagram illustrating an example of a condition of an air circulating means during maintenance.

FIG. 4 is a diagram illustrating an example of a state of the air circulating means 20 during maintenance. FIG. 4 illustrates a state of performing maintenance by opening the air circulating means 20a at one end. As illustrated in FIG. 4, the air circulating means 20a seals the circulating region P in an openable and closable manner. Specifically, during normal operation of the wafer inspection apparatus 10 or the like, the air circulating means 20a seals the opening formed at the end of the circulating region P. Meanwhile, during maintenance of the wafer inspection apparatus 10, the air circulating means 20a rotates the FFU 21a, the suction fan 22a, and the duct 23a about the rotational axis extending in the height direction. This opens the opening formed at the end of the circulating region P. Thus, the maintenance of the circulating region P can be readily performed.

Figure 5:
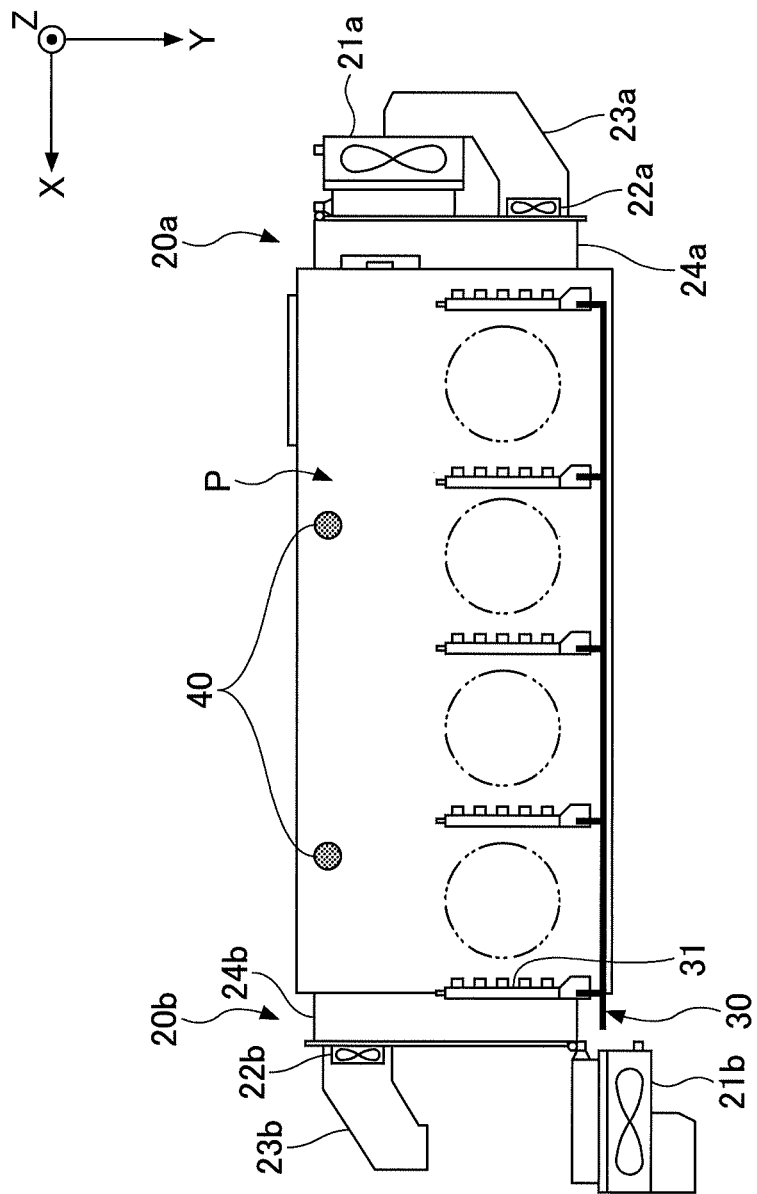
FIG. 5 is a diagram illustrating another example of a condition of an air circulating means during maintenance.

FIG. 5 is a diagram illustrating another example of a state of the air circulating means 20 during maintenance. FIG. 5 illustrates a state when the other air circulating means 20b is opened for maintenance. As illustrated in FIG. 5, the air circulating means 20b seals the circulating region P in an openable and closable manner. Specifically, during normal operation of the wafer inspection apparatus 10 or the like, the air circulating means 20b seals the opening formed at the end of the circulating region P. Meanwhile, during maintenance of the wafer inspection apparatus 10, the air circulating means 20b rotates the FFU 21b and part of the duct 23b about a rotational axis extending in a height direction without rotating the suction fan 22b. This opens part of the opening formed at the end of the circulating region P. Thus, maintenance of the circulating region P can be readily performed. In the example of FIG. 5, the rotation radius can be reduced because the suction fan 22b is not rotated during normal and maintenance periods. Therefore, even when a chiller pipe and the like are installed near the end of the circulating region P, it is possible to prevent the air circulating means 20b from interfering with the chiller pipe and the like.

Working Example

Figure 6:
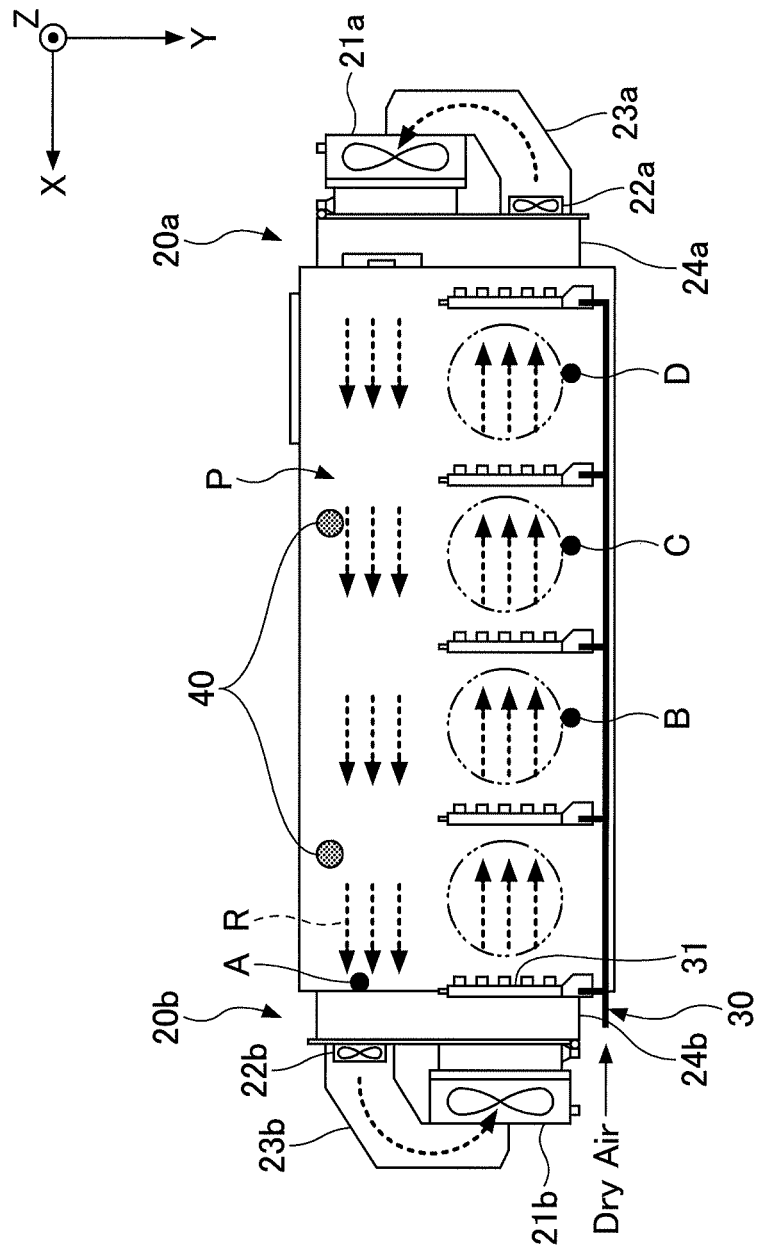
FIG. 6 is a diagram illustrating a particle measurement point.

Next, a working example for confirming the effect of the wafer inspection apparatus 10 according to an embodiment of the present invention will be described. FIG. 6 is a diagram illustrating a particle measurement point.

In the example, the number of particles in the circulating region P of the wafer inspection apparatus 10 was measured using a particle counter (particle counter). Specifically, in each of the states in which the wafer inspection device 10 is stopped (hereinafter, referred to as "stopped state") and the state in which the wafer inspection apparatus 10 is operated (hereinafter, referred to as "operating state"), the number of particles at four points A, B, C and D illustrated in FIG. 6 was measured. The operational state includes a state of performing a wafer inspection, a state of carrying a wafer and the like.

The particle numbers were measured at A, B, C and D in each of the stopped and operated states, and the airborne particle concentration limit standard of Class 100 was satisfied at each of the stopped states. In addition, the airborne particle concentration limit standard of Class 1000 was satisfied at any points in the operational state.

Although the embodiments for carrying out the present invention have been described above, the above description is not intended to limit the content of the invention, and various modifications and modifications can be made to the embodiments described above within the scope of the present invention.

In the above-described embodiment, the wafer inspection apparatus 10 having three stages in the height direction and four inspection parts in the lateral direction has been described with reference to the example. However, the present invention is not limited thereto, and the number of steps in the height direction may be one or more, and the number of steps in the lateral direction may be two or more.

This international application claims priority under Japanese Patent Application No. 2017-085424, filed on Apr. 24, 2017, the entire contents of which is incorporated herein by reference.

DESCRIPTION OF THE REFERENCE NUMERALS 10 wafer inspection apparatus
11 inspection chamber
12 inspection area
13 carry-in/out area
14 transfer area
17d controller
20, 20a, 20b air circulating means
21a, 21b FFU
22a, 22b suction fan
30 dry air supply means
31 dry air supply nozzle
40 dew point sensor
P circulating region
R circulating path

The invention claimed is:

1. A wafer inspection apparatus including a plurality of inspection parts arranged in a height direction and a lateral direction, comprising:
   a pair of air circulating means disposed at both ends in a longitudinal direction of an air circulating region including the plurality of inspection parts arranged in the lateral direction and configured to circulate air in the circulating region,
   wherein the pair of air circulating means forms a circulating path of air in a rotational direction about a rotational axis extending in a height direction.

2. The wafer inspection apparatus as claimed in claim 1, wherein the pair of air circulating means is disposed in each air circulating region.

3. The wafer inspection apparatus as claimed in claim 1, wherein the air circulating means includes a fan filter unit configured to blow clean air into the circulating region, and
   wherein the fan filter unit of one of the pair of the air circulating means and the fan filter unit of the other of the pair of the air circulating means are located diagonally to each other.

4. The wafer inspection apparatus as claimed in claim 1, wherein the air circulating means includes a suction fan configured to blow clean air into the circulating region, and
   wherein the suction fan of one of the pair of the air circulating means and the suction fan of the other of the pair of the air circulating means are located diagonally to each other.

5. The wafer inspection apparatus as claimed in claim 1, wherein the air circulating means seals the circulating region in an openable and closable manner.

6. The wafer inspection apparatus as claimed in claim 1, further comprising:
   a dry air supply means configured to supply dry air into the circulating region for decreasing a dew point of air in the circulating region.

7. The wafer inspection apparatus as claimed in claim 1, wherein the circulating region can be maintained at a dew point temperature of −40 degrees Celsius or lower.

8. The wafer inspection apparatus as claimed in claim 1, further comprising:
   a control means configured to control operation of the air circulating means,
   wherein the control means controls a flow rate of the air blown to the circulating region from the air circulating means in response to an operation state of the inspection part.

9. The wafer inspection apparatus as claimed in claim 8, further comprising:
   a dew point sensor provided in the circulating region,
   wherein the control means controls the flow rate of the air blown to the circulating region from the air circulating means based on a detection value of the dew point sensor.

* * * * *